United States Patent [19]

Oizumi et al.

[11] 4,398,987
[45] Aug. 16, 1983

[54] CONTINUOUS PRODUCTION OF ELECTRICAL LAMINATES

[75] Inventors: Masayuki Oizumi; Masaharu Abe, both of Kobe; Yasuo Fushiki, Takatsuki, all of Japan

[73] Assignee: Kanegafuchi Kagaku Kogyo Kabushiki Kaisha, Osaka, Japan

[21] Appl. No.: 286,846

[22] Filed: Jul. 27, 1981

[30] Foreign Application Priority Data

Jul. 28, 1980 [JP] Japan .................................. 55-104212
Jul. 28, 1980 [JP] Japan .................................. 55-104213

[51] Int. Cl.³ .......................................... B32B 31/08
[52] U.S. Cl. ................................ 156/324; 156/307.3; 156/307.7; 427/434.2; 428/268; 428/273; 428/284; 428/290; 428/417
[58] Field of Search ............... 156/307.3, 307.4, 307.7, 156/324; 427/434.2; 428/212, 284, 268, 273, 289, 290, 417

[56] References Cited

U.S. PATENT DOCUMENTS 3,726,750  4/1973  Stillings ......................... 156/324 X
4,230,521  10/1980  Cobb et al. ..................... 156/324 X Primary Examiner—Robert A. Dawson
Attorney, Agent, or Firm—Haight & Associates

[57] ABSTRACT

There is provided a method for continuous production of a laminated sheet product comprising transporting a plurality of continuous sheet component materials in vertically discrete relation, supplying an impregnating resin to each of the component materials, joining the resin-impregnated component materials to give an assembly and laminating a film material to either side of the assembly, all in a continuous sequence, the improvement wherein the resin-impregnated component materials are first transported in a substantially horizontal path, at least one substantially V-shaped or U-shaped path preceded by a declining path, and an ascending path in the order mentioned before the component materials are joined.

6 Claims, 2 Drawing Figures

CONTINUOUS PRODUCTION OF ELECTRICAL LAMINATES

BACKGROUND AND SUMMARY OF THE INVENTION

This invention relates to an improved method for continuous production of laminated sheet products and, more particularly, to a method for continuous production of laminated sheets which comprises transporting a plurality of continuous sheet component materials, drying or conditioning the same component materials if necessary, impregnating them with a curable resin composition, drying the same if necessary, joining the resin-impregnated component materials to give an assembly, laminating the assembly with a film material on either side, curing the resin and cutting the laminate to size or otherwise treating it.

The term "laminated sheet" as used throughout this specification and the claims appended thereto means such products as, in the main, electrical insulation sheets and copper foil laminates for printed circuit boards which are built into electrical appliances, electronic components and so on. Heretofore, such laminated sheets have been commercially produced batchwise, i.e. by impregnating a sheet material with a curable resin varnish, drying the varnished material, preparing prepregs corresponding to the specified size and pressing a plurality of the prepregs in superimposition under the influence of heat to provide a finished sheet product. However, this production method is procedurally complicated, requires a large production labor force, and is not as productive as might be desired. Thus, the industry needed a continuous, efficient production method. To overcome the disadvantages, several continuous processes have been proposed in recent years. In this regard, reference should be made to Japanese Unexamined Patent Publication Nos. 10390/1977, 88872/1978, 13572/1979, 4838/1980, etc.

These proposed methods for continuous production of a laminated sheet involve either one of the following processes.

(1) A plurality of discrete component sheet materials in transport are impregnated with a resin composition and a film is laminated with these resin-treated component sheets as the latter are joined together; or (2) A plurality of discrete sheet component materials in transport are joined to give an assembly in a resin bath and, thereafter, a film is laminated with the resin-impregnated sheet assembly.

The method described in Japanese Unexamined Patent Publication No. 4838/1980 comprises feeding a plurality of continuous sheet component materials in vertically discrete relation, applying an impregnating resin to said component materials from an overhead resin source, joining the component materials to give an assembly and finally laminating a film with the assembly, all in a continuous sequence. In this production method, where the resin is supplied from an overhead position, the impregnation process takes place only gradually so that it takes a long time for the resin to penetrate into component materials. This time depends on and varies with the type of component materials and the type and viscosity of the resin used but usually ranges from several minutes to scores of minutes. Moreover, to ensure an acceptable finished quality, the plurality of materials are preferably joined after the impregnation has progressed to a sufficient extent. Therefore, a sufficiently long path of travel must be provided between the stage at which the resin composition is applied and the stage where the plurality of discrete resin-impregnated materials are joined to give an assembly. However, if this path of travel is increased, the production equipment must be increased in size. To solve this problem and provide a production method which would not require a large equipment space yet ensure a satisfactory impregnation result, the present inventors conducted an intensive study and found that the above-mentioned objects can be accomplished by feeding a plurality of continuous sheet component materials in vertically discrete relation, supplying an impregnating resin composition to each of said component materials, joining the resin-impregnated component materials into an assembly, laminating a film material onto either side of said assembly, and curing the resulting laminate, all in a continuous sequence, wherein said resin-impregnated sheet component materials are transported in a substantially horizontal path, at least one substantially V-shaped or U-shaped path preceded by a gradually declining path, and an ascending path in the order mentioned before said component materials are joined.

This invention will be described in detail, reference being made to the accompanying drawings.

DETAILED DESCRIPTION OF THE INVENTION

Figure 1:
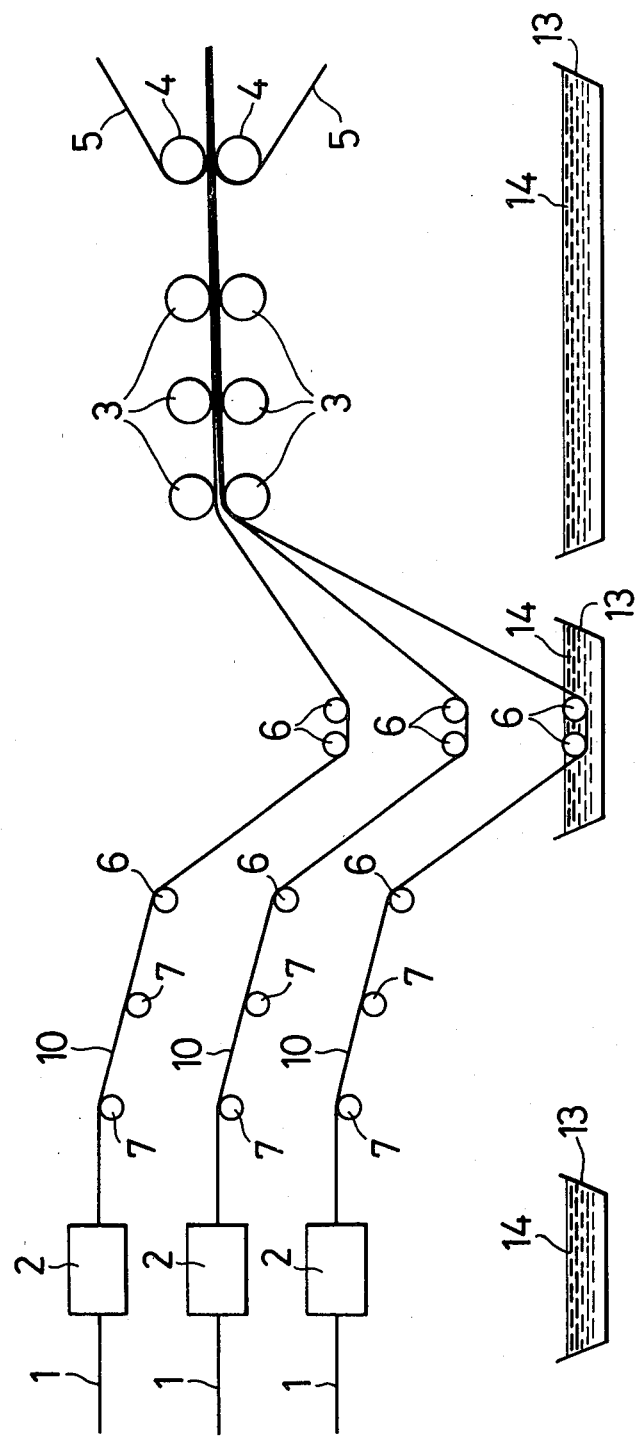
FIG. 1 is a schematic view showing an example of the equipment used in accordance with the method of this invention.

Referring to FIG. 1, which is a schematic view showing the equipment used for the practice of this invention, a plurality of continuous sheet component materials (1) are laid out from rolls at vertically discrete levels and transported at substantially equal speeds. For practical purposes, 2 to 10 such component materials are laid out and transported as mentioned above. In accordance with this invention, an impregnating resin composition is supplied to these sheet component materials from a resin impregnator (2) while they remain yet to be joined, i.e. in discrete relation. The term "sheet component material" as used herein means any and all resin-impregnatable materials such as glass cloth, nonwoven glass, cotton cloth, kraft paper, linter paper, cotton paper and other cellulose-based paper, asbestos web and other inorganic fabrics, polyester and other synthetic papers, and so on. Usually, these materials are supplied in rolls and measure 500 to 3000 meters per roll.

As the impregnating resin suited for the purposes of this invention, there may be mentioned such liquid self-curing thermosetting resin compositions as epoxy, diallyl phthalate and unsaturated polyester resin compositions. It is also possible to use solutions of resins in solvents, such as phenolic resin varnish, melamine resin varnish, epoxy resin varnish and so forth. When a solvent vehicle is employed, equipment for evaporating the solvent after impregnation is required and in such cases said sheet component materials are dried in discrete condition. It should be understood that the above-named resins are only examples and any other resin can be employed unless it interferes with the objects of this invention.

The resin-impregnated sheet component materials (10) are first transported in a substantially horizontal path. Thereafter, the materials (10) are guided in a declining path, then in substantially V-shaped or U-shaped path, finally in an ascending path before they are joined by joining means (3). The declining and V-shaped or U-shaped paths may be provided in repetition.

The resulting sheet assembly is then laminated with one or more surfacing film materials (5), which may for example be mold release paper, polyester or other plastic film, stainless steel or other metal foil, or electrolytic copper or iron film which is used for the manufacture of printed circuit boards and foil-clad laminates. As illustrated in FIG. 1, the above-mentioned changes of direction of path of resin-impregnated component materials are effected by means of one or more bars or rollers (6). The above production layout and method leads to the following advantages:

(1) Because the access of all the sheet component materials to the joining device is upward, the excess resin squeezed out by the device flows down under gravity so that there will be no excessive accumulation of the resin composition in the joining device.

(2) Probably because the resin-impregnated component materials are subjected to a compressive load in said approximately V-shaped or U-shaped path, this arrangement contributes to a more satisfactory impregnation result.

(3) In case an excess resin has been supplied, a certain degree of squeezing effect is obtained in said V-shaped or U-shaped path.

(4) As a most important aspect of this invention, this V-shaped or U-shaped path permits a longer transport distance and a longer impregnation time in a small floor space.

As regards said V-shaped or U-shaped path of travel, it may be further followed by at least one other similar path with or without the interposition of a downwardly declining path similar to that mentioned hereinbefore, in which case at least some of the above-mentioned advantages can be further increased.

The substantially horizontal path is preferably an arch-shaped path, as for example provided by rollers (7), for such an arch-shaped path contributes to a stable transport of resin-impregnated component materials without causing a transverse sway or displacement of the materials. The joining means (3) used in the method of this invention usually comprises pairs of rollers. Alternatively, at least the first upstream pair of rollers may be replaced by a single roller which is positioned in alignment with the lower roller of an adjacent pair to push up and join the resin impregnated materials. Such an arrangement of rollers also contributes to a sizable attenuation of said transverse sway of component materials.

A laminator (4), which is adapted to laminate film materials (5) with the joined component materials, is preferably disposed downstream and independently of said joining means (3). Since, in such an arrangement, the resin-impregnated component materials have already passed through the joining means, an appropriate resin ratio has been established in the materials at this stage. This means that the flow of resin which would interfere with lamination is substantially absent, that a stable continuous travel of the film and component materials without transverse sway or displacement is ensured, and that said laminator and the roll gaps of said rollers can be positioned and set to suit the resin viscosity, the transport speed of component materials, the thickness specification of the product, etc., thus contributing further to improved product quality and yield.

A preferred example of the device for feeding the resin composition and impregnating the sheet component materials therewith will now be described in detail. When, as in the present production method, 2 to as many as 10 component materials are transported in discrete relation and all concurrently, with resin impregnated, the use of conventional roll coaters in multiple stages will be inconvenient and take excessive space.

Figure 2:
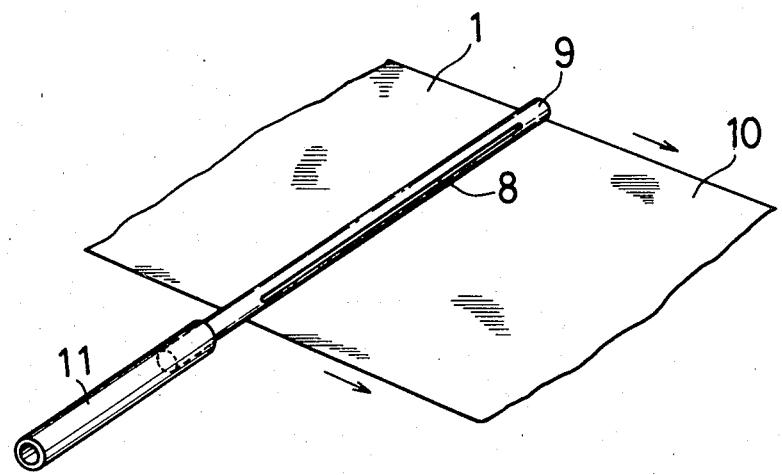
FIG. 2 is a schematic view showing a preferred device for supplying an impregnating resin composition.

The present inventors found that a simple and rational setup of supplying an impregnating resin from tubular means (9) each having a resin outlet (8) from above the component materials is very convenient and efficient. In FIG. 2 is shown such an impregnation arrangement. The resin outlet (8) may be optionally configured; for example it may be a slit or comprise a plurality of small orifices. At least one end of each tubular means is connected to a resin tank (not shown) via a hose (10) or the like, whereby the resin composition is supplied to the tubular means. A plurality of such tubular means are arranged in accordance with the number of sheet component materials.

In accordance with the present method described hereinbefore, the overflowing resin composition at the impregnation stage, the resin composition dripping from the component materials in said V-shaped or U-shaped path, and the excess resin composition squeezed out by said joining means all drip downwards. Since the proportion of the resin thus dripping down may reach several to scores of percents relative to the resin composition penetrating into the materials, such a drip loss would be very uneconomical. Therefore, it is preferable to dispose one or more resin receptacles (13) below the equipment.

Such receptacles are preferably disposed immediately below the V-shaped or U-shaped path. For more satisfactory results, such a receptacle is disposed in such an adjacent position that the downmost component material will come into contact with the resin composition (14) recovered in the receptacle, whereby an adequate amount of resin composition may be deposited on the bottom side of said downmost material and the entrapping of bubbles between this particular side and the film in the lamination stage is prevented. Although not shown, each receptacle is preferably provided with an outlet through which the recovered resin dope may be returned to the resin tank.

The method of this invention eliminates most of the various restrictions on resin viscosity and on the type of component materials to which the conventional methods are subject, thus enlarging the scope of application and increasing the efficiency of production.

It should be understood that the above description is merely illustrative of the present invention and that many changes and modifications may be made by those skilled in the art without departing from the scope of the appended claims.

What is claimed is:

1. In a method for continuous production of a laminated sheet product comprising transporting a plurality of continuous sheet component materials in vertically discrete relation, supplying an impregnating resin to each of said component materials, joining the resin-impregnated component materials with a joining device to give an assembly and laminating a film material to either side of said assembly, all in continuous sequence, the improvement wherein said resin-impregnated component materials are first transported in a substantially horizontal path, a declining path, at least one substantially upstanding V-shaped or U-shaped path, and finally an ascending path before said component materials are joined, so that excess resin squeezed out by the joining device flows down under gravity to avoid excessive accumulation thereof in the joining device.

2. A production method as set forth in claim 1 wherein said resin-impregnated component materials are joined by passing them through decreasing roll gaps of pairs of cooperating rollers.

3. A production method as set forth in claim 2 wherein the assembly of component materials after joining is passed through at least one pair of rollers for lamination with a film material on either side.

4. A production method as set forth in claim 1 wherein each of said component materials is impregnated with a resin fed onto the top side thereof.

5. A production method as set forth in claim 1 wherein at least one of said film materials is a cladding metal foil.

6. A production method as set forth in claim 1 which further includes a stage for removing the film material after curing.

* * * * *